United States Patent
Ormsbee et al.

(10) Patent No.: US 10,066,818 B2
(45) Date of Patent: Sep. 4, 2018

(54) SYSTEM AND METHOD FOR CONTROLLING A HEADLAMP HAVING A CAPACITANCE SENSOR

(71) Applicant: Nite Ize, Inc., Boulder, CO (US)

(72) Inventors: Bowden Ormsbee, Longmont, CO (US); Richard N. Case, Boulder, CO (US); Michael C. Boyd, Boulder, CO (US)

(73) Assignee: Nite Ize, Inc., Boulder, CO (US)

(*) Notice: Subject to any disclaimer, the term of this patent is extended or adjusted under 35 U.S.C. 154(b) by 0 days.

(21) Appl. No.: 15/670,567

(22) Filed: Aug. 7, 2017

(65) Prior Publication Data

US 2017/0356634 A1 Dec. 14, 2017

Related U.S. Application Data (62) Division of application No. 14/587,751, filed on Dec. 31, 2014, now Pat. No. 9,726,356.

(60) Provisional application No. 61/924,082, filed on Jan. 6, 2014.

(51) Int. Cl.

| H03K 17/945 | (2006.01) |
|---|---|
| F21V 21/30 | (2006.01) |
| F21L 4/04 | (2006.01) |
| F21V 21/084 | (2006.01) |
| H05B 37/02 | (2006.01) |
| H03K 17/96 | (2006.01) |
| H03K 17/955 | (2006.01) |

(52) U.S. Cl.
CPC ............ *F21V 21/30* (2013.01); *F21L 4/04* (2013.01); *F21V 21/084* (2013.01); *H03K 17/955* (2013.01); *H03K 17/962* (2013.01); *H05B 37/0227* (2013.01)

(58) Field of Classification Search
CPC ............ H03K 17/955; H03K 17/962; H03K 2217/94052
USPC ................. 345/173; 235/451; 327/514, 517; 362/103, 105
See application file for complete search history.

(56) References Cited

U.S. PATENT DOCUMENTS

| 2,910,575 A | 10/1959 | Meschwitzer et al. |
|---|---|---|
| 4,574,334 A | 3/1986 | Igura |
| 5,363,291 A | 11/1994 | Steiner |
| 5,386,592 A | 2/1995 | Checkeroski |
| 5,436,810 A | 7/1995 | Sutherland et al. |
| 5,541,816 A | 7/1996 | Miserendino |

(Continued)

OTHER PUBLICATIONS

International Search Report issued in PCT Application No. PCT/US14/73044 dated Jun. 3, 2015 (4 pages).

(Continued)

*Primary Examiner* — Thuy Vinh Tran
(74) *Attorney, Agent, or Firm* — Haynes and Boone, LLP (57) ABSTRACT

A system for controlling a headlamp includes a computing device and a capacitance sensor. A method for operating the headlamp includes detecting a first change at a first sensor on the headlamp and determining if the first change is a first swipe. The method further includes activating a first light of the headlamp in response to the first swipe and detecting a second change at the first sensor on the headlamp. The method further includes determining the second change is a hold and cycling the intensity of the first light of the headlamp in response to the second change.

8 Claims, 5 Drawing Sheets

(56) References Cited

U.S. PATENT DOCUMENTS

| | | |
|---|---|---|
| 5,608,919 A | 3/1997 | Case |
| 5,641,220 A | 6/1997 | Sutherland et al. |
| 5,696,424 A | 12/1997 | Coushaine |
| 5,738,431 A | 4/1998 | Lary |
| 5,800,042 A | 9/1998 | Blank |
| D405,202 S | 2/1999 | Fattori et al. |
| D470,615 S | 2/2003 | Janice et al. |
| 6,547,415 B1 | 4/2003 | Matthews |
| D477,680 S | 7/2003 | Petzl |
| 6,712,485 B2 | 3/2004 | Matthews |
| D492,052 S | 6/2004 | Schnell |
| D500,377 S | 12/2004 | Yamamoto et al. |
| 6,877,875 B2 | 4/2005 | Yu et al. |
| 6,879,930 B2 * | 4/2005 | Sinclair ............... G06F 3/03547 702/150 |
| 6,896,389 B1 | 5/2005 | Paul |
| 6,908,208 B1 | 6/2005 | Hyde et al. |
| 6,923,551 B2 | 8/2005 | Galli |
| 6,953,260 B1 | 10/2005 | Allen |
| 7,048,407 B2 | 5/2006 | Kumthampinij et al. |
| 7,077,302 B2 | 7/2006 | Chuang |
| D531,335 S | 10/2006 | Garrity |
| 7,125,139 B2 | 10/2006 | Kumthampinij et al. |
| D544,621 S | 6/2007 | Kim |
| 7,278,764 B2 | 10/2007 | Kim |
| 7,284,875 B2 | 10/2007 | Kim |
| 7,293,898 B2 | 11/2007 | Kumthampinij et al. |
| 7,303,302 B2 | 12/2007 | Harris |
| D560,298 S | 1/2008 | Spartano et al. |
| 7,370,991 B1 | 5/2008 | Ellis-Fant |
| 7,478,918 B2 | 1/2009 | Petzl et al. |
| 7,490,949 B2 | 2/2009 | Medinis |
| 7,513,660 B2 | 4/2009 | Spartano et al. |
| 7,549,763 B2 | 6/2009 | Kim et al. |
| 7,568,812 B1 | 8/2009 | Kumthampinij et al. |
| 7,635,195 B2 | 12/2009 | Tarter |
| 7,695,156 B2 | 4/2010 | Hurwitz |
| D615,680 S | 5/2010 | Kim |
| 7,722,205 B2 | 5/2010 | Kim |
| 7,815,342 B2 | 10/2010 | Medinis |
| 7,918,578 B2 | 4/2011 | Spartano et al. |
| 7,922,349 B2 | 4/2011 | Hunnewell et al. |
| 8,001,623 B2 | 8/2011 | Gertsch et al. |
| D648,468 S | 11/2011 | Gibson |
| D649,272 S | 11/2011 | Araujo et al. |
| 8,066,396 B2 | 11/2011 | Hunt |
| 8,147,083 B2 | 4/2012 | Uke |
| 8,157,401 B2 | 4/2012 | Lau |
| 8,172,430 B2 | 5/2012 | Alessio |
| 8,177,384 B2 | 5/2012 | Boulan |
| 8,201,961 B2 | 6/2012 | Lau |
| 8,210,703 B2 | 7/2012 | Wu |
| 8,292,450 B2 | 10/2012 | Kim |
| 8,297,779 B2 | 10/2012 | Martin et al. |
| 8,348,448 B2 | 1/2013 | Orozco et al. |
| 8,371,707 B2 | 2/2013 | Uzar |
| 9,209,803 B2 * | 12/2015 | Bruwer ................ H03K 17/955 |
| 2012/0057331 A1 | 3/2012 | Janice |
| 2014/0267068 A1 * | 9/2014 | Smith .................. H03K 17/962 345/173 |

OTHER PUBLICATIONS

International Preliminary Report on Patentability issued in PCT Application No. PCT/US14/73044 dated Jul. 12, 2016 (6 pages).

* cited by examiner

SYSTEM AND METHOD FOR CONTROLLING A HEADLAMP HAVING A CAPACITANCE SENSOR

CROSS-REFERENCE TO RELATED APPLICATIONS

This application is a divisional of U.S. application Ser. No. 14/587,751 filed on Dec. 31, 2014, and issued as U.S. Pat. No. 9,726,356 on Aug. 8, 2014, which claims the benefit of US Provisional Patent Application No. 61/924,082 filed Jan. 6, 2014, and is incorporated by reference to the same extent as though fully contained herein.

TECHNICAL FIELD

Embodiments described herein generally relate to headlamps.

BACKGROUND

Headlamps are popular for many activities that take place in low light situations. Some examples include hiking in the early morning or at night, as well as fishing, hunting, and a variety of other activities that may take place at night or in the early morning. In numerous situations, a user may desire an adjustable headlamp for lighting areas in a hands-free manner. It is desirable that the direction of the light be adjustable as well.

SUMMARY

In one embodiment, a headlamp includes a module assembly, a back of the module assembly including a geared portion, the geared portion including a plurality of grooves and protrusions, the module assembly including a lighting module. The headlamp further includes a holder; the holder pivotally attached to the module assembly; the holder includes a tab mounted on a flexible tab arm; the tab and flexible tab arm positioned such that the tab interfaces with the geared portion of the back; the module assembly being rotatable in relation to the holder; the tab ratcheting from one groove to another groove of the plurality of grooves; and the flexible tab arm flexing to allow the tab to pass over the protrusions of the geared portion. Optionally, the geared portion is an arc of a circle oriented to complement the rotation of the module assembly in relation to the holder. In one configuration, the tab is wedge shaped, and the grooves complement the wedge shape of the tab. In another configuration, the module assembly includes a front portion and a rear portion, the front portion and the rear portion being hingedly connected. Optionally, the rear portion includes a notch, the notch positioned to receive a tab mounted on a wire latch attached to the front portion, the tab and wire latch and notch interface causing the front and rear portion to remain closed together. Alternatively, the tab is rounded and rotatably mounted on the wire latch such that it may rotate against the notch and snap down into place in an attachment rest of the rear portion. In one alternative, the rear portion includes a release area adjacent to the attachment rest, the release area being a depression that allows for a user to place a finger under the tab in the attachment rest and release the tab. In another alternative, the module assembly includes a first receiver and a second receiver for receiving a first pin and a second pin of the holder, the first and second receivers and the first and second pins providing for the pivotal attachment. Optionally, the holder includes a first slot and a second slot for holding a strap, the first and second slots separated by a vertical bar. Alternatively, the vertical bar includes a break, the break allowing for the perpendicular insertion of the strap without necessitating a length of the strap be run through the first and second slots. Optionally, the first and second pins extend from the first and second arms which extend perpendicularly from a base portion of the holder.

In another embodiment, a headlamp includes a module assembly, the module assembly including a lighting module, wherein the module assembly includes a front portion and a rear portion, the front and rear portions being hingedly connected; the rear portion including a notch, the notch positioned to receive a tab mounted on a wire latch attached to the front portion; and the tab, wire latch, and notch interface causing the front and rear portions to remain closed together. The headlamp further includes a holder, the holder pivotally attached to the module assembly. Optionally, a back of the module assembly includes a geared portion, the geared portion including a plurality of grooves and protrusions; the holder including a tab mounted on a flexible tab arm; the tab and flexible tab arm positioned such that the tab interfaces with the geared portion of the back; the module assembly being rotatable in relation to the holder; the tab ratcheting from one groove to another groove of the plurality of grooves; and the flexible tab arm flexing to allow the tab to pass over the protrusions of the geared portion. Alternatively, the tab is rounded and rotatably mounted on the wire latch such that it may rotate against the notch and snap down into place in an attachment rest of the rear portion. Optionally, the rear portion includes a release area adjacent to the attachment rest, the release area being a depression that allows for a user to place a finger under the tab in the attachment rest and release the tab.

In one embodiment, a method of directing a headlamp includes providing a headlamp. The headlamp includes a module assembly, a back of the module assembly including a geared portion, the geared portion including a plurality of grooves and protrusions, the module assembly including a lighting module. The headlamp further includes a holder, the holder pivotally attached to the module assembly; and the holder includes a tab mounted on a flexible tab arm, the tab and flexible tab arm positioned such that the tab interfaces with the geared portion of the back; the module assembly being rotatable in relation to the holder; the tab ratcheting from one groove to another groove of the plurality of grooves; and the flexible tab arm flexing to allow the tab to pass over the protrusions of the geared portion. The method further includes rotating the module assembly in relation to the holder. The method further includes ratcheting the tab from one groove to another groove of the plurality of grooves. The method further includes holding the tab in another groove and holding the module assembly in position.

In one embodiment, a method for operating a headlamp includes detecting a first change at a first sensor on the headlamp. The method further includes determining the first change is a first swipe and activating a first light of the headlamp in response to the first swipe. Optionally, the first change is a change in capacitance; and the first sensor is a capacitance sensor. Alternatively, the first swipe is in a first direction, and the method further includes detecting a second change at the first sensor; determining the second change is a second swipe; and deactivating the first light of the headlamp in response to the second swipe. Optionally, the second swipe is in a second direction, different from the first direction. Alternatively, the first swipe is in a first direction, and the method further includes detecting a second change at the first sensor; determining the second change is a second swipe; and changing the mode of operation of the first light of the headlamp in response to the second swipe. Optionally, the second swipe is in the first direction. In one alternative, the method further includes detecting a third change at the first sensor on the headlamp; determining the third change is a third swipe; and activating a second light of the headlamp in response to the third swipe. Optionally, the third swipe is in a third direction, different from the first direction. In another alternative, the method further includes detecting a second change at the first sensor on the headlamp; determining the second change is a hold; and cycling the intensity of the first light of the headlamp in response to the second change. Optionally, the method further includes detecting a third change at the first sensor on the headlamp; determining the third change is a hold for a requisite period of time; detecting a fourth change at the first sensor on the headlamp; determining the fourth change is a third swipe; and locking the headlamp in response to the third swipe. Optionally, the method further includes detecting a fifth change at the first sensor on the headlamp; determining the fifth change is the hold for the requisite period of time; detecting a sixth change at the first sensor on the headlamp; determining the sixth change is a fourth swipe; and unlocking the headlamp in response to the fourth swipe.

In one embodiment, a system for controlling a headlamp includes a computing system that is configured to detect a first change at a first sensor on the headlamp; determine the first change is a first swipe; and activate a first light of the headlamp in response to the first swipe. Optionally, the first change is a change in capacitance, and the first sensor is a capacitance sensor. Alternatively, the first swipe is in a first direction and the computing system is configured to: detect a second change at the first sensor; determine the second change is a second swipe; and deactivate the first light of the headlamp in response to the second swipe. Optionally, the second swipe is in a second direction, different from the first direction. Alternatively, the first swipe is in a first direction, and the computing system is configured to: detect a second change at the first sensor; determine the second change is a second swipe; and change the mode of operation of the first light of the headlamp in response to the second swipe. Optionally, the second swipe is in the first direction. In one alternative, the computing system is configured to: detect a third change at the first sensor on the headlamp; determine the third change is a third swipe; and activate a second light of the headlamp in response to the third swipe. Optionally, the third swipe is in a third direction, different from the first direction. Alternatively, the computing system is configured to: detect a second change at the first sensor on the headlamp; determine the second change is a hold; and cycle the intensity of the first light of the headlamp in response to the second change. In one alternative, the computing system is configured to: detect a third change at the first sensor on the headlamp; determine the third change is a hold for a requisite period of time; detect a fourth change at the first sensor on the headlamp; determine the fourth change is a third swipe; and lock the headlamp in response to the third swipe. Optionally, the computing system is configured to: detect a fifth change at the first sensor on the headlamp; determine the fifth change is the hold for the requisite period of time; detect a sixth change at the first sensor on the headlamp; determine the sixth change is a fourth swipe; and unlock the headlamp in response to the fourth swipe.

DETAILED DESCRIPTION OF THE DRAWINGS

Described herein are embodiments of systems and methods for a headlamp.

Figure 1:
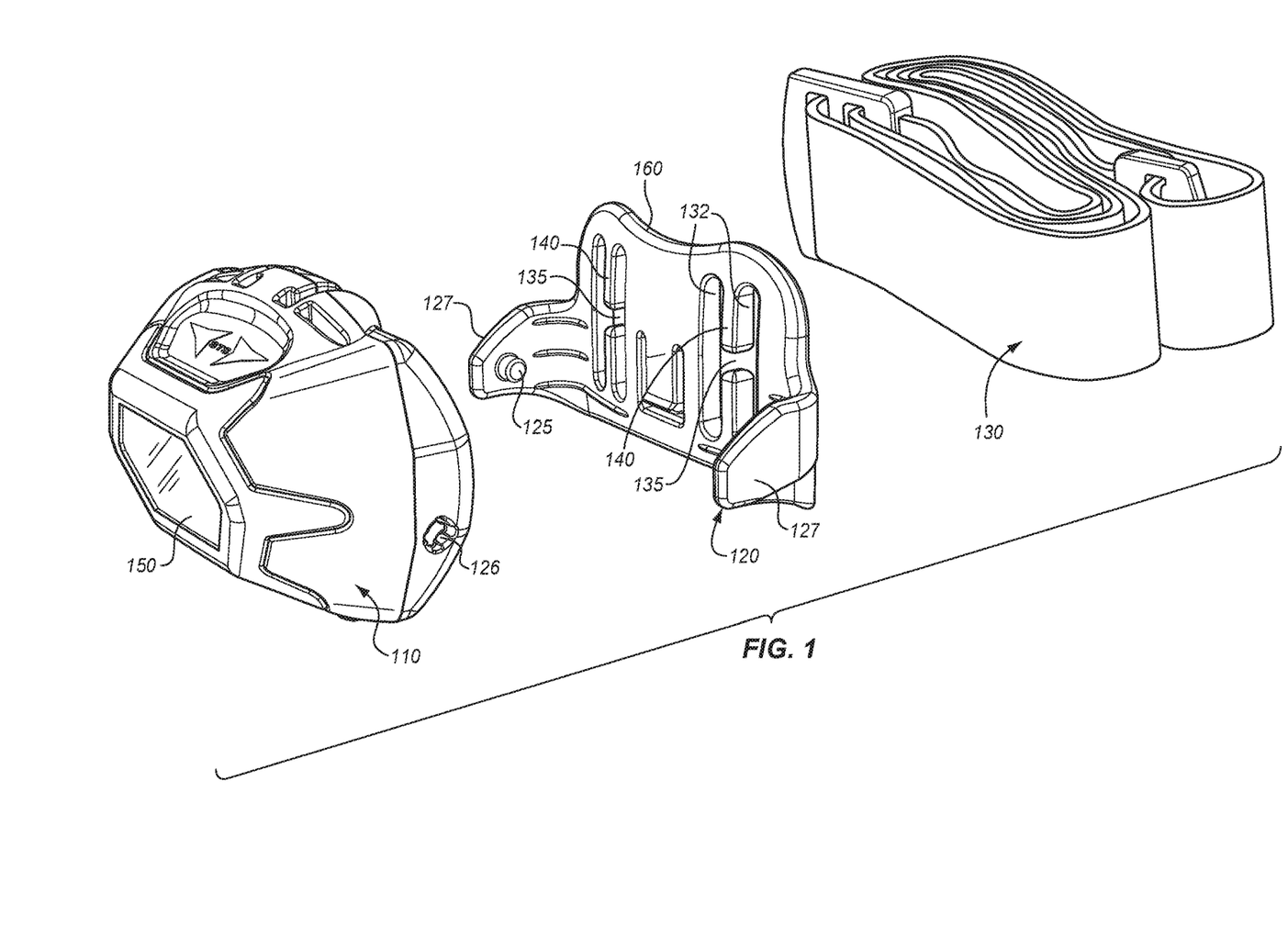
FIG. 1 shows an exploded view of one embodiment of a headlamp.

FIG. 1 shows an exploded view of one embodiment of a headlamp. Headlamp 100 includes a module assembly 110, a holder 120, and an adjustable strap 130. Module assembly 110 fits with holder 120. Pin 125 and receiver 126 provide for an up and down rotation of module assembly 110. The other pin 125 and receiver 126 are not shown in this view but may be apparent in other views. Lens 150 assists in protecting and focusing the light from a lighting module. Pins 125 are positioned on arms 127 that extend perpendicularly away from a base portion 160 of holder 120. Base portion 160 includes strap slots 132.

Strap slots 132 receive adjustable strap 130. Strap slots 132 include a break 135 in the vertical bar 140 of strap slots 132. In this way, the strap may be passed through break 135 in vertical bar 140 in a perpendicular fashion and then flattened to a parallel position to hold in strap slots 132. This reduces the complexity of having to run strap 130 through strap slots 132.

Figure 2:
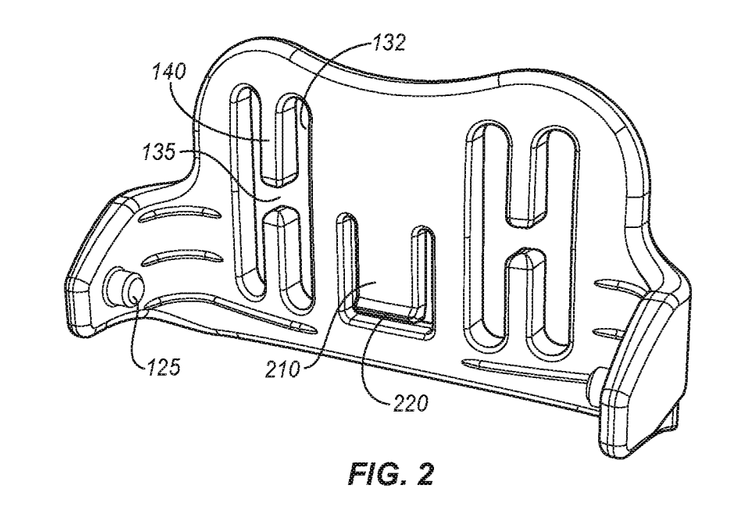
FIG. 2 shows the holder portion of the headlamp of FIG. 1.

FIG. 2 shows holder 120. Visible in this figure are a more detailed view of pin 125, as well as strap slots 132, break 135, and vertical bar 140. Tab 220 and flexible tab arm 210 are also shown in this view. As is described later herein, tab 220 interfaces with the geared back of module assembly 110.

Figure 3:
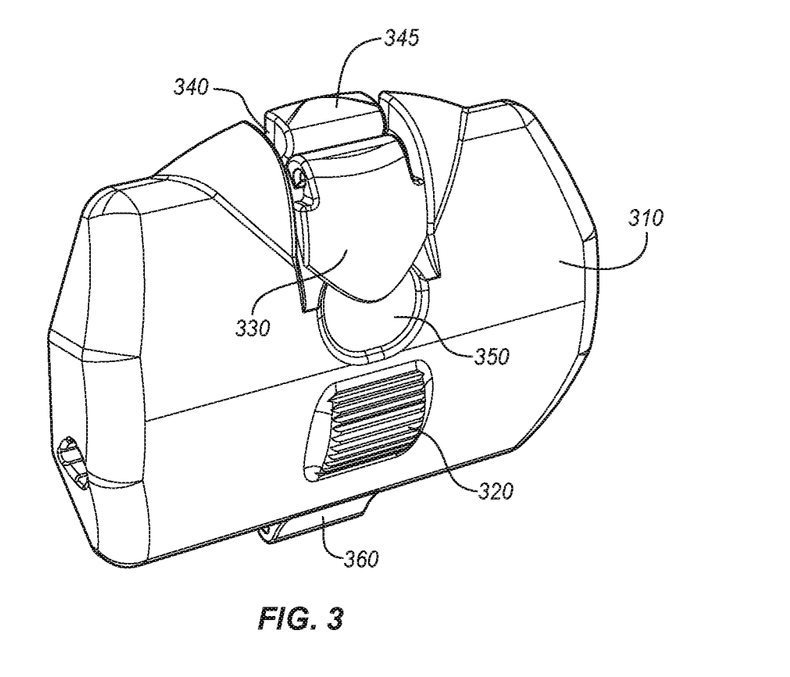
FIG. 3 shows the back portion of the module assembly of the headlamp of FIG. 1.

FIG. 3 shows the back 310 of module assembly 110. Back 310 may include a geared section 320. Geared section 320 is designed to interface with tab 220. When module assembly 110 is mounted in holder 120, tab 220 may fit between the teeth of geared section 320. In order to rotate module assembly 110 up or down, the user turns module assembly 110 about pins 125. Flexible tab arm 210 may then flex, allowing tab 220 to slide over the teeth of geared section 320 and into another slot in geared section 320. In this way, module assembly 110 may be ratcheted and positioned up and down. Back 310 also includes attachment groove 340, notch 345, attachment rest 330, and release area 350. These aspects will be described in greater detail in relation to the front portion of module assembly 110. Rotatable joint piece 360 may allow for interface with the front portion of module assembly 110 as described below.

Figure 4:
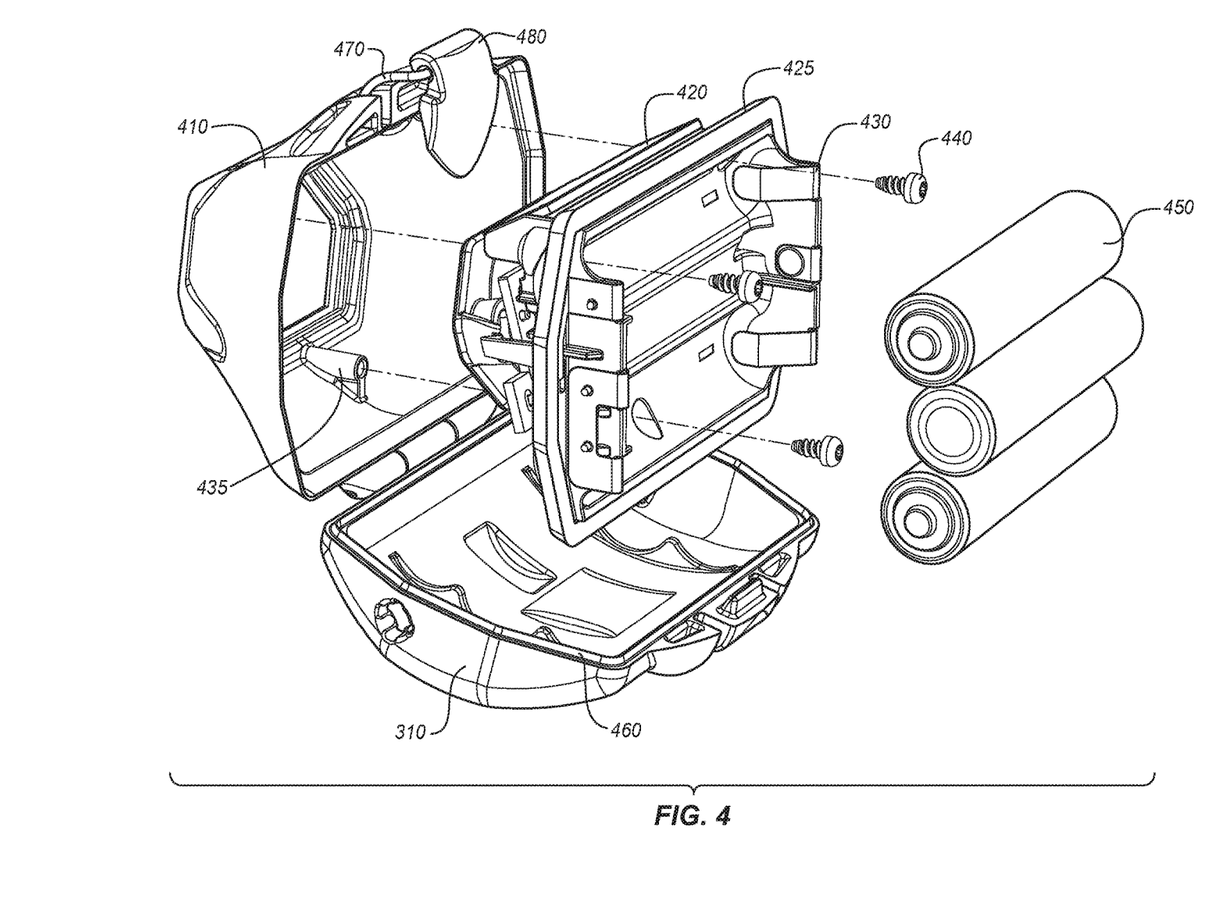
FIG. 4 shows an exploded portion of the module assembly of the headlamp of FIG. 1.

FIG. 4 shows an exploded portion of module assembly 110. Front portion 410 is designed to interface with rear portion 310. Light module 420 is mounted onto battery module assembly 425. Battery module assembly 425 includes battery area 430 for receiving and mounting batteries 450. Although AA batteries are shown, various types of batteries may be used. Battery module assembly 425 is mounted to front portion 410 using screws 440, which are inserted into receivers 435. Front portion 410 seals to back 310 along gasket edge 460. Wire latch 470 and tab 480 pivot in a receiving area of front portion 410. Tab 480 interfaces with notch 345, and wire latch 470 rests in groove 340. Tab 480 may be composed of a rubber-like or flexible material such that tab 480 may compress slightly when interfacing with notch 345. In some embodiments, this may create a waterproof seal between the front portion and the rear portion. The edge of tab 480 is rounded such that it may rotate against notch 345 before resting in attachment rest 330. The user may release tab 480 by placing a finger under tab 480 in release area 350 and lifting up.

Figure 5:
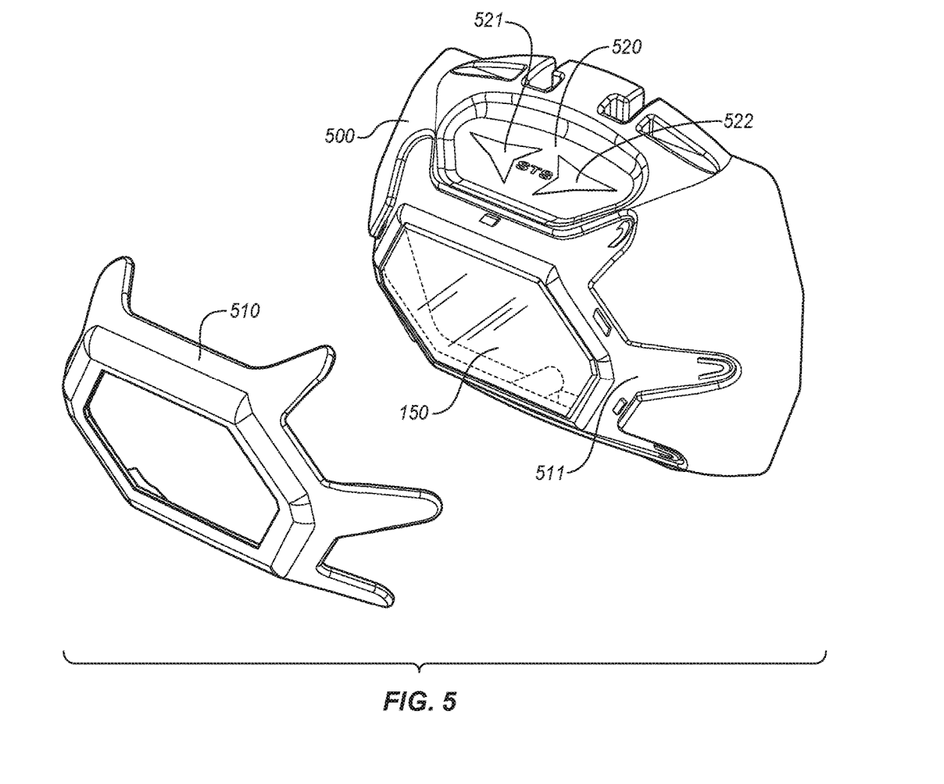
FIG. 5 shows an embodiment of a front portion of a module assembly.

FIG. 5 shows an embodiment of a front portion 500 designed to integrate with rear portion 310. This view shows bezel 510 and bezel groove 511. Also shown is the control section 520 for module assembly 110. This control section 520 includes first and second arrows 521, 522 for increasing and decreasing the intensity of the light projected by module assembly 110. The control section 520 is in the form of an ergonomic channel that makes it easier for the user to control the lighting system as well as find the control section 520. The combination of the control section 520 and the swipe-to-activate system is a useful feature of the headlamp. With systems that merely have touch activation, the touch activation area is difficult to find; and when the user finds the touch activation area, many times they activate the light unintentionally. This may especially be true when the system includes multiple touch activation buttons. When many functions are included with a touch activation light, there are essentially two ways to provide control of the light. One way is to have a single button that responds to different combinations of touches, including number of touches and length of touches. Another possibility is to have multiple touch buttons. The issue with this configuration is that either the use must remove the headlamp to identify the button the user desires to push or the buttons must be located in a diverse set of locations, so that there is little chance of accidental contact. These configurations are less desirable. The advantage of the configuration of many embodiments shown herein is that the user can easily find the channel for swiping in the system.

In one configuration, the system operates in the following fashion. The control section may be swiped in either a left-to-right or a right-to-left fashion to activate the system and change modes. A swipe in the left-to-right direction will activate the white light. A swipe in the right-to-left direction will activate the red light. A subsequent swipe in the same direction as a previous activation swipe within a set time period changes the mode of operation from high intensity to low intensity light. A second subsequent swipe in the same direction within a set time period will cause the mode of operation to switch to flashing. A subsequent swipe in the opposite direction as a previous swipe will deactivate the light. If after activating a light the user rests his or her finger on the control pad, the light will cycle from low to high light over a set interval. In some embodiments, a lock feature is included to prevent the accidental activation of the light during periods of non-use. To lock the light, the user holds the control section with two fingers until the device blinks once, and then the user swipes the control section in either direction. In order to unlock, the user holds the control pad with two fingers until the device blinks once and then swipes in either direction, resulting in an activation of the light corresponding to the direction of swipe.

Figure 6:
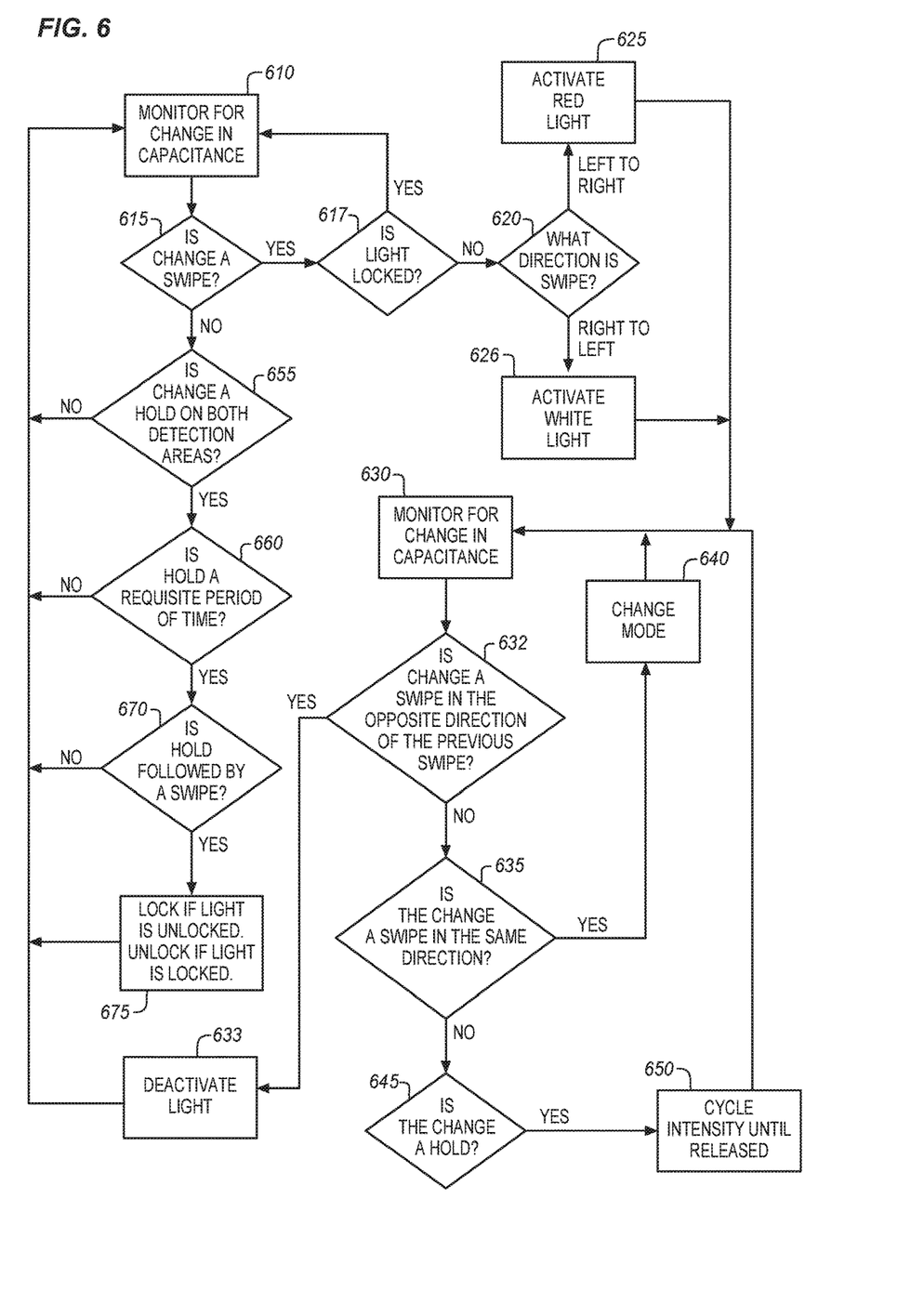
FIG. 6 is a flow chart of one embodiment of a method of controlling the lighting device using a control section.

FIG. 6 shows one embodiment of a method of controlling the lighting device using the control section. Control section 520 is generally a capacitance sensing circuit that may sense a swipe across it. Such sensors may include those described in U.S. Pat. No. 6,249,089; U.S. Pat. No. 6,952,084; U.S. Pat. No. 6,984,900; U.S. Pat. No. 7,084,531; U.S. Pat. No. 8,395,395; and U.S. Pat. No. 8,531,120. Control section 520 is typically a tape with copper traces, in many cases including three traces. Control section 520 is controlled and monitored by a computing system included with the lighting device.

The computing system may implement an algorithm, program, or other type of method to control the lighting device in response to changes in capacitance. In operation, in block 610, the computing system monitors control section 520 for a change in capacitance. When a change is detected in block 615, the computing system determines whether the change was a swipe. If yes, then the system determines in block 617 whether the light is locked. If the light is locked, the system continues to monitor for changes in capacitance and takes no other action. If the light is not locked, then the flow proceeds to block 620. In block 620, the direction of the swipe is determined. If it is left to right, the red light will be activated in block 625. If it is right to left, then the white light will be activated in block 626. Note that these directions are arbitrary, and the light may be designed to initiate either light in response to a swipe in either direction, as well as including additional features as part of swiping. For instance, a swipe in one direction may activate a light, and a swipe in the opposite direction may activate another system. Other systems may include, but are not limited to, music systems such as radios, MP3 players, etc.; beacon systems indicating the location of a user; GPS systems; mobile calling systems, etc. Virtually any system may be configured to be activated by a swipe in either direction. In block 630, the system continues to monitor for a change in capacitance. If a change is detected, it is determined whether the swipe is in the opposite direction as the previous swipe in block 632. If it is, then the light is deactivated in block 633 and flow returns to block 610. If not, if the swipe is in the same direction as detected in block 635, then in block 640, the mode of operation is changed and the system continues to monitor for capacitance changes in block 630. Changing the mode of operation means that the system will cycle each time an additional swipe is sensed in the same direction. For instance, after the first swipe is noted, the system will turn on at high intensity. After the second swipe, the system will switch to low intensity. After the third swipe, the system will change to flashing. After the fourth swipe, the system will change back to high intensity, and so on in a repeating fashion. This is just an example of the mode changes that may occur. Other mode changes are possible. If the change is not a swipe but instead a hold as determined in block 645, the system will cycle the intensity of the light, stepping from low to high in a repeated fashion until the hold is released in block 650. The intensity will continue at the intensity at the point of release. The system then will return to monitoring for changes in capacitance in block 630.

The system may also include a lock mode. In block 615, if the light is not yet in operation and in block 655 a hold on both detection areas is detected, then in block 660, it is determined whether the hold was for a preset period of time. In many embodiments, this time period will be two seconds, although the time may vary. In many embodiments, the light will blink (once or twice) to indicate that the hold has been long enough. In block 670, it is determined whether the hold is followed by a swipe. If it is, then in block 675, the light is either locked if it is unlocked, or unlocked and turned on according to the direction of the swipe if it is locked. Alternatively, the light may be merely unlocked if it is locked, and the unlocking may be indicated by a blink of the light. When the light is in lock mode, it may only be released by a hold for two seconds followed by a swipe. This makes it extremely difficult to accidentally activate the light and inadvertently run down the power supply.

Note that the method described in FIG. 6 is merely an exemplary method for how to program and operate a light using control section 520. In alternative embodiments, various other methods of operation may be implemented. In many embodiments, a combination of providing for swipes and holds allows for additional configurations of an indicator with a single input area. Therefore, a user may use the same input area to swipe or hold the input area. This lessens the complexity of the command sequences that need to be remembered and increases the possible combinations of commands. In many embodiments, inputs may include a swipe in a first direction, a swipe in a second direction, and a hold for a period of time. Using these combinations, many more possibilities are available than just using holds for various periods of time in various combinations. The system created is much more intuitive and easy to use. The system may alternatively use an inductance-based sensor or other type of sensor responding to touch or other field changes resulting from the close proximity of a human finger or other body part.

Various embodiments of systems and methods for a headlamp, including the swipe capacitance controls, may be implemented fully or partially in software and/or firmware. This software and/or firmware may take the form of instructions contained in or on a non-transitory computer-readable storage medium. Those instructions then may be read and executed by one or more processors to enable performance of the operations described herein. The instructions may be in any suitable form, such as, but not limited to, source code, compiled code, interpreted code, executable code, static code, dynamic code, and the like. Such a computer-readable medium may include any tangible non-transitory medium for storing information in a form readable by one or more computers, such as, but not limited to, read only memory (ROM); random access memory (RAM); magnetic disk storage media; optical storage media; a flash memory, etc.

The previous detailed description is of a small number of embodiments for implementing the systems and methods for a headlamp and is not intended to be limiting in scope. The following claims set forth a number of the embodiments of the systems and methods for a headlamp disclosed with greater particularity.

What is claimed:

1. A method for operating a headlamp, the method comprising:
    detecting a first change at a first sensor on the headlamp;
    determining if the first change is a first swipe, wherein the first swipe is a movement of a user's finger across the first sensor in one of a left-to-right fashion and a right-to-left fashion;
    activating a first light of the headlamp in response to the first swipe^ detecting a second change at the first sensor on the headlamp: determining the second change is a hold, wherein the hold is a holding of the user's finger on the first sensor for a period of time; and
    cycling the intensity of the first light of the headlamp in response to the second change.

2. The method of claim 1, wherein the first change is a change in capacitance, and the first sensor is a capacitance sensor.

3. A method for operating a headlamp, the method comprising:
    detecting a first change at a first sensor on the headlamp;
    determining if the first change is a first swipe, wherein the first swipe is a movement of a user's finger across the first sensor in one of a left-to-right fashion and a right-to-left fashion;
    activating a first light of the headlamp in response to the first swipe, wherein the first swipe is in a first direction and the method further comprises:
    detecting a second change at the first sensor;
    determining if the second change is a second swipe, wherein the second swipe is a movement of a user's finger across the first sensor in one of a left-to-right fashion and a right-to left fashion; and
    deactivating the first light of the headlamp in response to the second swipe;
    detecting a third change at the first sensor on the headlamp;
    determining if the third change is a hold, wherein the hold is a holding of the user's finger on the first sensor for a requisite period of time;
    detecting a fourth change at the first sensor on the headlamp;
    determining if the fourth change is a third swipe, wherein the third swipe is a movement of a user's finger across the first sensor in one of a left-to-right fashion and a right-to-left fashion; and
    locking the headlamp in response to the third swipe.

4. The method of claim 3, further comprising:
    detecting a fifth change at the first sensor on the headlamp;
    determining if the fifth change is the hold, wherein the hold is a holding of the user's finger on the first sensor for the requisite period of time;
    detecting a sixth change at the first sensor on the headlamp;
    determining if the sixth change is a fourth swipe, wherein the fourth swipe is a movement of a user's finger across the first sensor in one of a left-to-right fashion and a right-to-left fashion; and
    unlocking the headlamp in response to the fourth swipe.

5. A system for controlling a headlamp, the system comprising:
    a first sensor; and
    a computing system configured to:
    detect a first change at the first sensor on the headlamp;
    determine if the first change is a first swipe, wherein the first swipe is a movement of a user's finger across the first sensor in one of a left-to-right fashion and a right-to-left fashion;
    activate a first light of the headlamp in response to the first swipe;
    detect a second change at the first sensor on the headlamp;
    determine if the second change is a hold, wherein the hold is a holding of the user's finger on the first sensor for a requisite period of time; and
    cycle the intensity of the first light of the headlamp in response to the second change.

6. The system of claim 5, wherein the first change is a change in capacitance, and the first sensor is a capacitance sensor.

7. A system for controlling a headlamp, the system comprising:

a first sensor; and
a computing system configured to:
detect a first change at the first sensor on the headlamp:
determine if the first change is a first swipe, wherein the first swipe is a movement of a user's finger across the first sensor in one of a left-to-right fashion and a right-to-left fashion;
activate a first light of the headlamp in response to the first swipe; wherein the first swipe is in a first direction;
detect a second change at the first sensor;
determine if the second change is a second swipe;
deactivate the first light of the headlamp in response to the second swipe, wherein the second swipe is in a second direction, different from the first direction;
detect a third change at the first sensor on the headlamp;
determine if the third change is a hold, wherein the hold is a holding of the user's finger on the first sensor for a requisite period of time;
detect a fourth change at the first sensor on the headlamp;
determine if the fourth change is a third swipe; and
lock the headlamp in response to the third swipe.

8. The system of claim 7, wherein the computing system is configured to further:
detect a fifth change at the first sensor on the headlamp;
determine if the fifth change is the hold for the requisite period of time;
detect a sixth change at the first sensor on the headlamp;
determine if the sixth change is a fourth swipe, wherein the fourth swipe is a movement of a user's finger across the first sensor in one of a left-to-right fashion and a right-to-left fashion; and
unlock the headlamp in response to the fourth swipe.

* * * * *